United States Patent [19]

O'Sullivan et al.

[11] Patent Number: 5,310,580
[45] Date of Patent: May 10, 1994

[54] ELECTROLESS METAL ADHESION TO ORGANIC DIELECTRIC MATERIAL WITH PHASE SEPARATED MORPHOLOGY

[75] Inventors: Eugene J. O'Sullivan, Upper Nyack; Terrence R. O'Toole, Webster; Judith M. Roldan, Ossining; Lubomyr T. Romankiw, Briarcliff Manor; Carlos J. Sambucetti, Croton-on-Hudson; Ravi Saraf, Briarcliff Manor, all of N.Y.

[73] Assignee: International Business Machines Corporation, Armonk, N.Y.

[21] Appl. No.: 874,665

[22] Filed: Apr. 27, 1992

[51] Int. Cl.⁵ .............................................. B05D 2/06
[52] U.S. Cl. .................... 427/307; 427/304; 427/305; 427/306; 427/282; 427/404; 427/407.1; 427/419.1; 427/96; 427/98; 430/8
[58] Field of Search .................. 427/304–307, 427/96, 404, 407.1, 98, 419.1, 393.5, 282; 430/8

[56] References Cited

U.S. PATENT DOCUMENTS

| | | | |
|---|---|---|---|
| 2,278,722 | 4/1942 | Loiseleur | 91/683 |
| 2,454,610 | 11/1948 | Narcus | 117/47 |
| 2,865,785 | 12/1959 | Coles | 117/46 |
| 2,872,359 | 2/1959 | Saubestre | 117/213 |
| 3,011,920 | 12/1961 | Shipley, Jr. | 117/213 |
| 3,370,973 | 2/1968 | Romankiw | 117/124 |
| 4,152,477 | 5/1979 | Haruta et al. | 427/307 |
| 4,216,246 | 8/1980 | Iwasaki et al. | 427/307 |
| 4,618,568 | 10/1986 | Gemmler | 430/417 |
| 4,701,351 | 10/1987 | Jackson | 427/98 |
| 4,870,751 | 10/1989 | Antoon | 29/846 |
| 4,927,865 | 5/1990 | Duthaler et al. | 522/48 |
| 4,940,609 | 7/1990 | Tschang et al. | 427/304 |
| 4,948,707 | 8/1990 | Johnson et al. | 430/11 |
| 4,959,121 | 9/1990 | Dumas et al. | 427/307 |
| 5,032,488 | 7/1991 | Finter | 430/270 |
| 5,045,436 | 9/1991 | Tieke et al. | 430/315 |
| 5,133,840 | 7/1992 | Buchwalter | 427/307 |

FOREIGN PATENT DOCUMENTS 0056093 7/1982 European Pat. Off. .

OTHER PUBLICATIONS

Romankiw, "Electroless Metallization of Polymers", IBM Technical Disclosure Bulletin, vol. 13, No. 5, Oct. 1970, p. 1199.
Romankiw, "Selective Activation of Metal Salt Loaded Polyimide By Exposure to Plasma", IBM Technical Disclosure Bulletin, vol. 25, No. 7A, Nov. 1982, pp. 3336–3338.
"Surface Activation of Dielectrics for Electroless Plating", IBM Technical Disclosure vol. 33, No. 9, Feb. 1991, pp. 418–421.

*Primary Examiner*—Janyce Bell
*Attorney, Agent, or Firm*—Philip J. Feig; Stephen C. Kaufman

[57] ABSTRACT

Improved adhesion of electroless metal deposited on an organic dielectric layer with phase separated morphology is accomplished by the spontaneous formation of a morphologically and topographically rough surface. In one embodiment a ternary solution of a polar solvent and two polymer precursors of the same polymer which are separable in two phases of different order are cast in film on a substrate and heated to form two phases of different order to spontaneously produce a rough surface. Upon exposure to an alkaline solution, one phase is etched at a faster rate than the other. Seeding and electroless deposition of a metal on the rough surface results in improved adhesion of the metal to the dielectric layer. In a second embodiment a quaternary solution of a polar solvent, a seeding agent, two polymer precursors of the same polymer which are separable in two phases of different order are cast in a thin film on a substrate and heated to form three phases. Upon curing the precursors there is surface roughening as a result of phase separation. Upon exposure to alkaline solution there is etching of one of the polymer phases at a faster rate and simultaneous opening of the seeding colloid. The rough surface is overcoated with a photoresist, exposed and developed. Subsequent electroless metal deposition results in improved metal to dielectric layer adhesion. The method is applicable to selective deposition of electroless copper onto a polyimide layer.

16 Claims, 6 Drawing Sheets

ELECTROLESS METAL ADHESION TO ORGANIC DIELECTRIC MATERIAL WITH PHASE SEPARATED MORPHOLOGY

BACKGROUND OF THE INVENTION

The present invention relates to a method of improving adhesion between a metal and an organic dielectric material when the metal is electrolessly deposited on the organic dielectric layer. Specifically, the invention relates to the formation of the dielectric material layer exhibiting phase separated morphology and rough surface topography of at least two phases of the dielectric material and the utilization of a dispersed catalyst seed layer to improve the adhesion of subsequently electrolessly deposited metal onto the dielectric layer. Quite specifically, the invention concerns selective electroless deposition of copper, nickel, cobalt, gold, palladium or any other electroless metal or metal alloy onto polyimide with improved adhesion.

Electroless copper deposition on polyimide principally using palladium as a seed layer has important applications in high-end microelectronics technology. However, improving the adhesion between the deposited copper and the polyimide is a major problem.

U.S. Pat. No. 3,370,973 describes a method in which a ternary solution of a polar solvent such as NMP (normal methyl pyrrolidone), a Pd bearing salt and polyimide is formed. The solution is cast as a very thin film, which upon spinning and drying has 25 to 50 Å particles of Pd colloid dispersed uniformly throughout the layer. If the amount of Pd salt is low (below 0.01% in the ternary solution and in the range between 0.001 to 0.0001% in the final film), after a conventional polyimide curing step, upon exposure to an alkaline solution, or to a plasma of air, nitrogen or the like, the Pd colloidal particles are exposed and act as catalytic sites for electroless copper (metal or metal alloy) deposition. Since many electroless baths are alkaline, it is possible to expose the Pd colloidal dispersion in the polyimide in situ, in the bath.

Since the colloidal particles are separated by a distance of 400 to 600Å or more and the particles themselves are only 25 to 50Å and the dielectric properties of the Pd containing polymer film is not affected and current leakage between plated copper lines shows no surface conductivity as a result of the presence of the particles. Surface leakage and conductivity can be increased by increasing the loading of the solvent-polyimide mixture with additional Pd salt. If desired, the loading can be increased to the level of nearly metallic conductivity.

Adhesion of electroless copper or nickel on Pd doped polyimide which shows no visible presence of Pd (very low concentration) is described in U.S. Pat. No. 3,370,973 and the film adhesion strength was equivalent to approximately 30 to 50 g/mm. The adhesion was postulated to be primarily due to mechanical interlocking of Pd particles.

Selective plating through resist masks and activation by forming gases after resist exposure, alkaline treatment or forming gas plasma ashing is described in IBM TDB vol. 13, October 1970, p. 1199 and in IBM TDB vol. 25, December 1982, pp. 3336–38.

U.S. Pat. Nos. 4,618,568 and U.S. Pat. No. 5,032,488 describe the use of radiation to deposit and/or reduce Pd-salt for surface activation that may be used for electroless plating.

U.S. Pat. Nos. 4,948,707 and 4,701,351 use an alkaline solution (NaOH) to hydrolyze an organic surface for Pd-salt deposition. In U.S. Pat. No. 4,948,707 the surface is roughened ex-situ, by the addition of a separate roughening step.

U.S. Pat. No. 5,045,436 and IBM TDB vol. 33, February 1991, p. 418–421 describe activation by thermal degradation of Pd-salt. However, both references fail to describe the use of a precursor polyimide blend.

U.S. Pat. No. 4,940,609 describes surface modification using a chemical process involving quaternary amine salts. That is, chemical means is used to achieve adhesion rather than physical properties related to mechanical interdigitation at a 100–1000 Å scale.

In accordance with the teachings of the present invention, a morphologically and topographically rough surface is spontaneously formed, without any ex-situ roughening process. The rough surface provides enhanced adhesion, not previously obtained by physical roughening of organic dielectric layers.

SUMMARY OF THE INVENTION

In a first preferred embodiment of the invention, a ternary solution of a polar solvent (NMP) and two different precursors of the same polyimide, for example, PMDA-ODA (pyromelletic dianhydride - 4, 4' oxydianiline), upon casting in a thin film form and heating to a temperature of approximately 300° to 400° C. separate into two phases dispersed with different order spontaneously forming a rough surface. The micro-structure is termed morphological composite because the two phases are chemically identical but of different order. Upon exposure to an alkaline solution, such as KOH or NAOH, one phase is selectively etched to a larger extent than the other, thereby producing an interdigitated interface for plating. Upon conventional seeding by immersion in Pd containing activation solution and subsequent electroless plating very good adhesion of (electroless) copper to the roughened surface was observed.

In a second preferred embodiment the above method was extended to allow roughening and simultaneous selective activation for use with permanent resist, such as PSPI (photo sensitive polyimide). Accordingly, a quaternary solution is prepared of a polar solvent, such as NMP, palladium salt, and two precursors of the same polymer (or similar species which upon casting will segregate into two polymer phases). The deposited film after drying and heating contains three phases. As will be described below, after partial curing, the surface is treated with an alkaline solution for opening the Pd colloidal Pd catalyst. The rough surface is caused by the phase separated morphology overcoated with PSPI, exposed and developed. The three-phase-containing film is heated to a temperature of at least 300° to 350° C. but not to a fully ordered state. The result is good polymer to polymer bonding and good PSPI to polymer adhesion upon full cure. Improved adhesion is achieved.

The present invention concerns a process of in situ forming of substrate roughness by mixing polymer precursors in a solution having at least two phases. The mixture yields molecules having different imidization temperatures which result in in situ surface roughness when mixed and cured. However, upon baking, the polymer film is chemically indistinguishable from a "pure form" polyimide since the precursors result in the same polyimide upon curing.

It is possible to achieve adhesion greater than 100 g/Mm due to the in situ molecular induced roughness described above. Moreover, high resolution plating and selective seeding with good adhesion is achieved when practicing the present invention.

A principal object of the present invention is therefore, the provision of improved adhesion between electrolessly plated metal and an organic dielectric polymer substrate by the in situ and spontaneous formation of surface roughness resulting from the mixing of polymer precursors which separate into phases.

Another object of the invention is the provision of improved adhesion between electrolessly plated metal and an organic dielectric substrate made from a ternary solution of a polar solvent and two polymer precursors of the same polymer.

A further object of the invention is the provision of improved adhesion between electrolessly plated metal and a polymer substrate where a quaternary solution of a polar solvent, seeding salt, and two polymer percursors of the same polymer is employed.

A still further object of the invention is the provision of improved adhesion between electrolessly plated copper and a polyimide substrate.

Further and still other objects of the present invention will become more clearly apparent when the following description is read in conjunction with the accompanying drawing.

DETAILED DESCRIPTION

Since copper and polyimide do not exhibit significant chemical interaction, the present invention provides a method of spontaneously, morphologically and topographically roughening a polyimide surface without performing any ex situ surface roughening process step.

In a first preferred method of practicing the present invention a ternary solution is formed. The solution contains polyamic acid (PAA) and its corresponding ester form (PAETE) to produce a well mixed emulsion in a polar solvent, preferably NMP. The solution is spin coated on a substrate to produce a two phase separated morphology. The spun layer is heated to a temperature sufficient to cure the PAA but not cure the PAETE. For a PMDA-ODA system, the temperature is in the range between 120° and 150° C. and preferably approximately 120° C. The temperature is then increased to cure the other polymer. The increased temperature is in the range between 160° and 220° C. and preferably is approximately 210° C. Then the film is further heated to a temperature in the range between 300° and 400° C., and preferably 350° C., to induce differential order between the polyimides formed from the two precursors. The resultant morphology is a more ordered polyimide film having the fingerprint of the original phase separated morphology. The film is then seeded using conventional techniques, such as is described in the article by M. M. Plechaty and R. R. Thomas entitled "Chemical Surface Modification of a Polyimide: Characterization and a Kinetic Study in the Diffusion of Ions in a Modified Polymer", IBM Research Report RC15807, (#70278), May 30, 1990, which is incorporated Tierein by reference, in order to produce palladium seed. Due to the phase separated morphology, alkaline etching, with KOJI or NaOH for example, is selective (higher attack is manifest at the less ordered regions) producing a large amount of seeding in the less ordered region. Subsequently deposited copper will be deposited in the pits and hills of the surface thereby producing an interdigitated morphology and the original phase-separated morphology is retained, maintaining uniform chemical composition of the film, that is homopolymer polyimide. The polymer/metal structure is subsequently heated to approximately 400° C. in the case of PMDA-ODA to ensure good mechanical property of the polymer and metal/polymer interface.

Figure 1A:
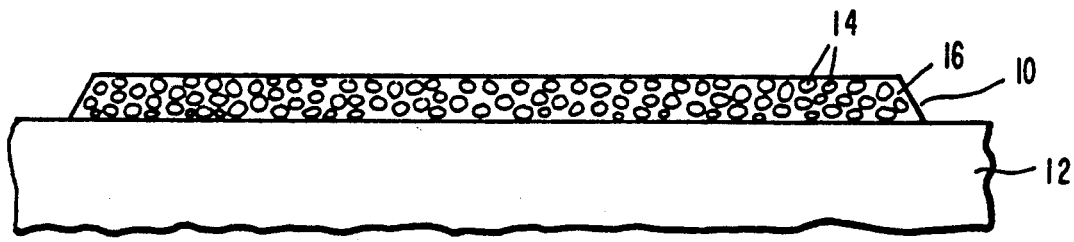
FIGS. 1a, 1b and 1c are schematic representations of the copper adhesion to polyimide mechanism in accordance with the teachings of the present invention.
Figure 1B:
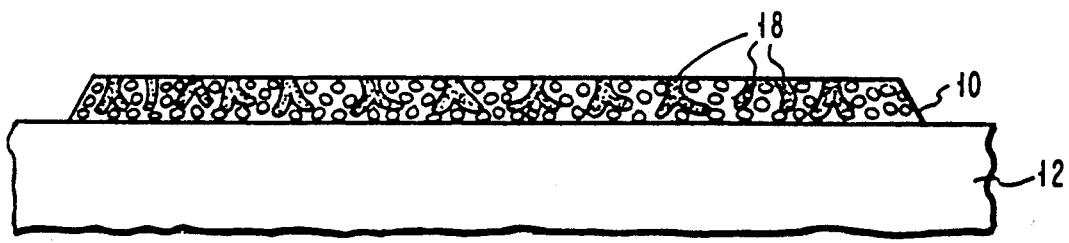
Figure 1C:
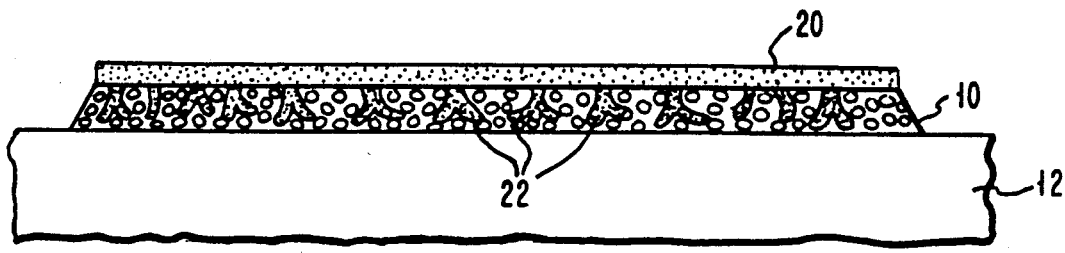

Referring to FIG. 1a, there is shown a polyimide layer 10 on a substrate 12 produced by imidizing a phase separated PAA/PAETE mixture of polyimide particles 14 arising from PAA imidization of PI binder from imidization of PAETE 16. The substrate is preferably composed of a silicon, ceramic, glass or the like. The spacing between particles is in the range between 200 Å and several microns depending upon the precursor composition, i.e. PAA/PAETE ratio. In FIG. 1b the darkened regions 18 are etched faster and hence show more seeded regions indicative of the roughened surface morphology of the film layer. FIG. 1c illustrates the morphology of an electrolessly plated copper layer 20 on the polyimide layer 10 with finger-like copper projections 22 extending into the roughened layer 16 for enhanced adhesion of the copper to the polyimide. The FIGURES show schematically exaggerated results to better represent the interdigitated morphology. in actual examples, seeding occurs in both regions, but less so on the ordered regions.

Figure 7A:
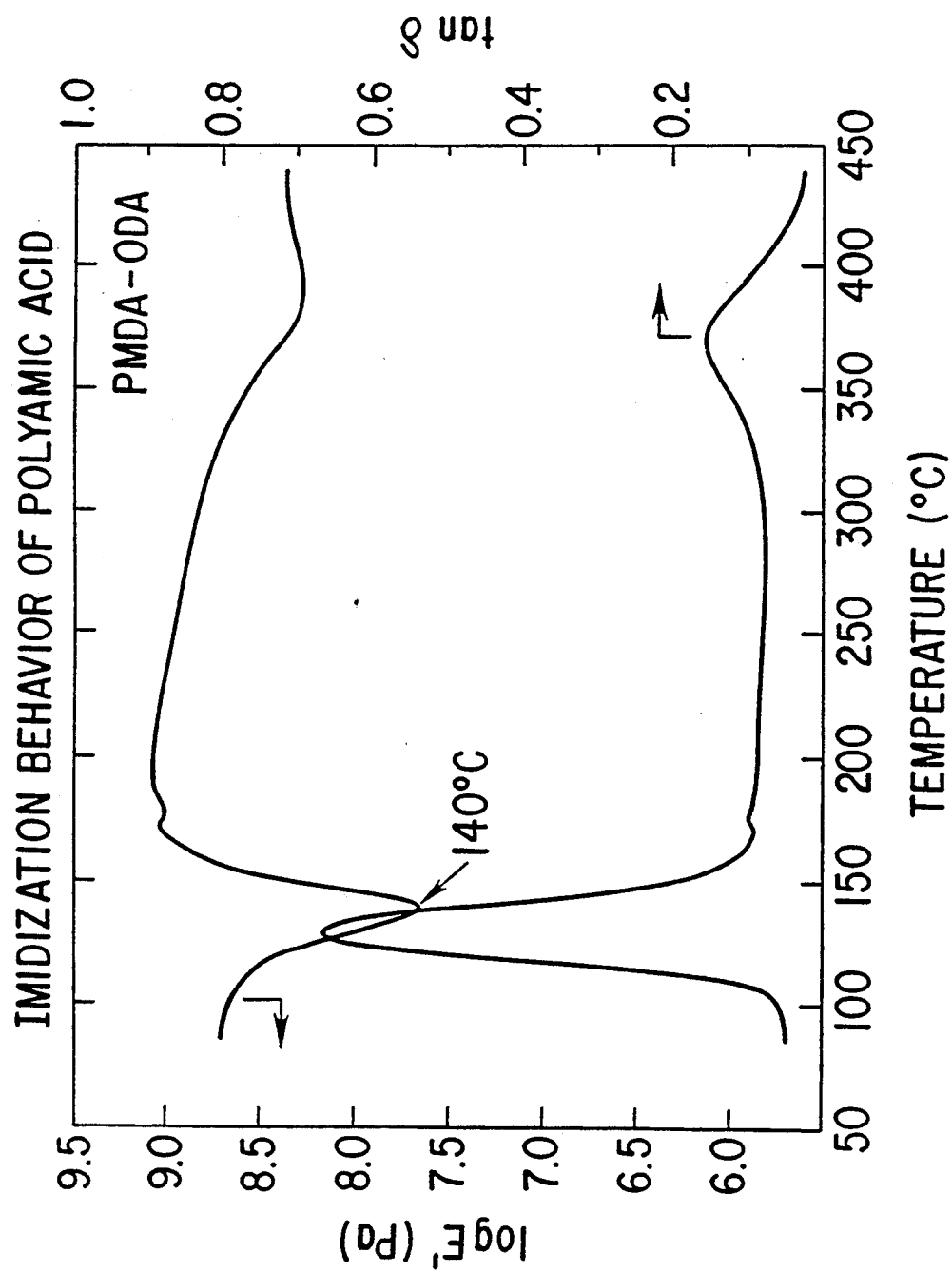
Figure 7B:
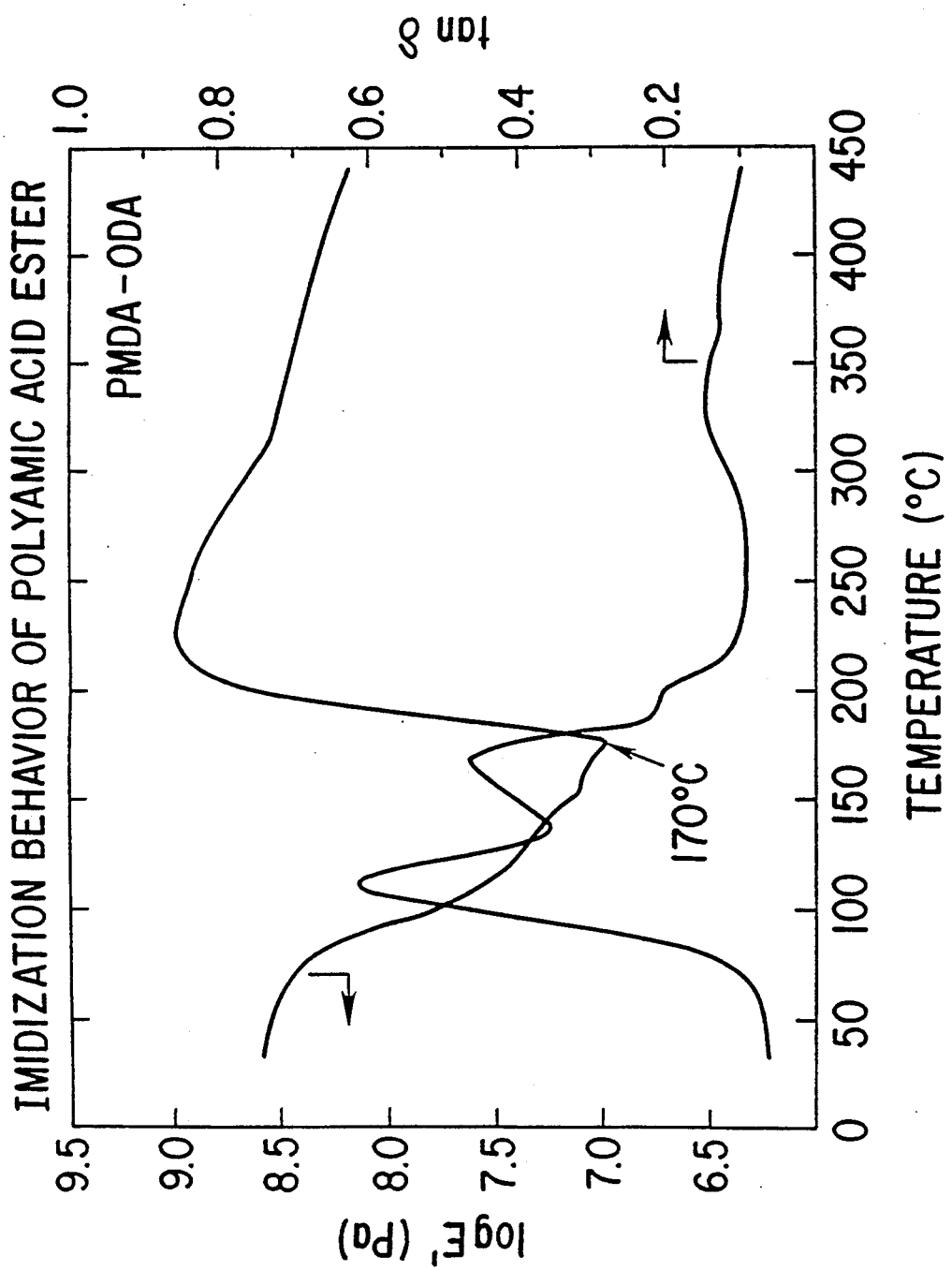

A pyromelletic dianhydride (PMDA) and 4, 4'-oxydianiline (ODA) based system is used to demonstrate improved copper-polyimide adhesion. The change in modulus shown in FIG. 7a and 7b as a function of temperature during the curing cycle monitors the imidization of the polyimide from its precursors. The onset of increased modulus indicates the imidization process for PAA 5878 and PAETE 5801 are 140° and 170° C., respectively.

Figure 2:
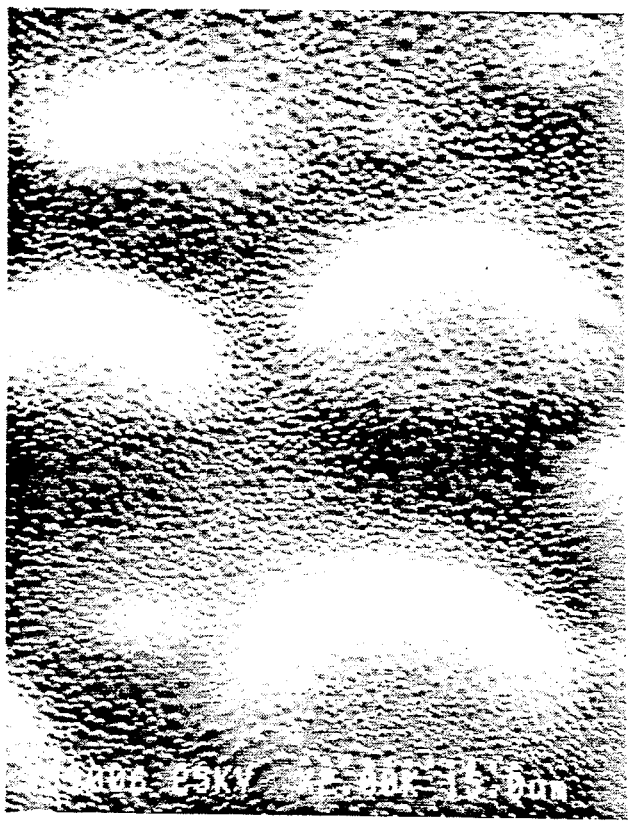
FIG. 2 is a SEM micrograph picture of 50/50 (wt %) PAA/PAETE polyimide film prepared in accordance with the present invention.
Figure 3:
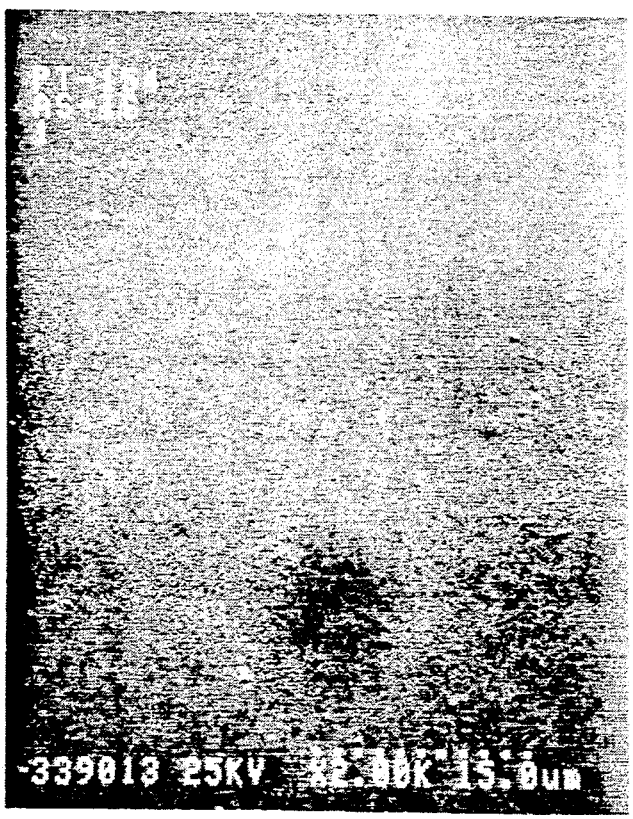
FIG. 3 is a SEM micrograph picture of pure PAA-5878 polyimide film.

A 50/50 (wt %) mixture of PAA/PAETE in approximately 17% NMP (N-methyl Pyrrolidone) was spun coated on a glass slide at 2000 to 3000 RPM to form a uniform 10 to 15 micron film. The film was dried at 70° C. followed by a baking cycle to 350° C. in a forming gas atmosphere. The baking cycle was a ramp temperature increase from 25° to 150° C. at 5° C. per minute followed by an isothermal annealing for 20 minutes at 150° C. to cure the PAA, then another ramp temperature increase from 150° to 220° C. at 5° C. per minute followed by an isothermal annealing for 30 minutes at 220° C. to cure the PAETE, then a final ramp temperature increase from 220° to 350° C. at 5° C. per minute followed by an isothermal annealing at 350° C. for 30 minutes, then a ramp temperature decrease at 10° C. per minute to a thermal soak at 25° C. The resultant sample was pure PMDA-ODA polyimide with a rough surface as seen in the SEM micrograph picture shown in FIG. 2. FIG. 3 is a SEM micrograph picture of a featureless smooth surface of polyimide film made from pure PAA-5878 under the identical conditions.

The film formed from a phase separated PAA/PAETE mixture was seeded by a conventional electroless seeding process. The adhesive peel strength of the electroless plated copper on a polyimide sample in accordance with the teachings of the present invention averaged approximately 80 to 90 g/Mn with a maximum measured strength of 140 g/mm. In contrast, a control sample made from pure PAA-5878, yielded a peel strength of 30 g/mm which value is consistent with that published in the literature. Thus, the present invention resulted in an improvement of adhesion in excess of 300 percent.

Figure 4:
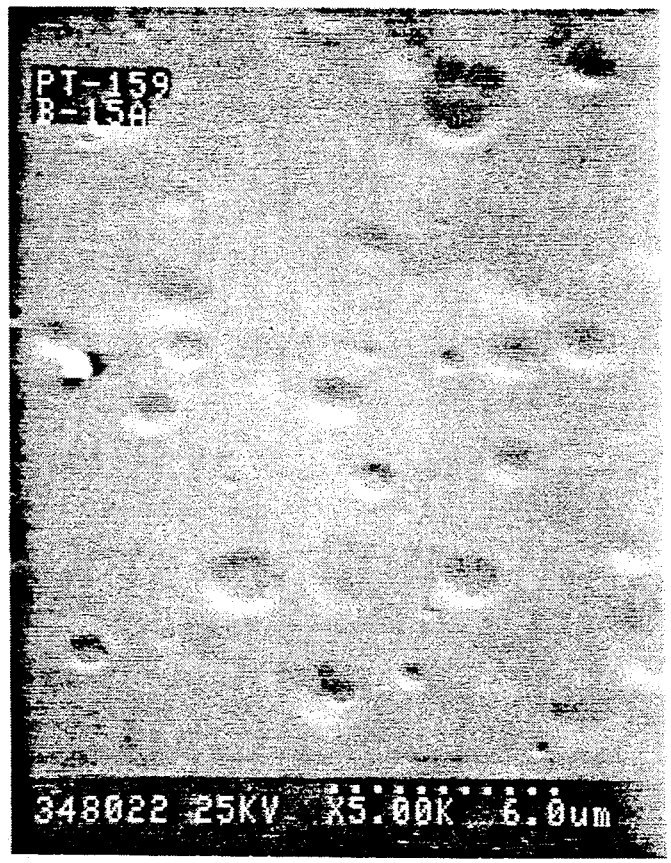
FIG. 4 is a SEM micrograph picture of 85/15 (wt %) PAA/PAETE polyimide film prepared in accordance with the present invention.

It should be noted that large features, those in the range of approximately 5 to 30 μm can be suppressed by modifying the mixture composition. FIG. 4 shows a SEM micrograph of a surface of 85/15 (wt %) PAA/PAETE mix made under similar curing cycle as that described above. The ability to suppress larger features is important where fine copper features are required to be formed on a surface. The surface morphology is observable before or after processing by observing the surface texture with a SEM, atomic force microscope (AFM) or by examining a microtomed section under a polarizing optical microscope.

In an improvement of the above process and in order to provide selective plating, a quaternary solution is prepared containing a polar solvent, palladium salt, PMDA-ODA precursors (or similar species which upon casting will segregate into two polymer phases). The solution after being spun on a substrate, dried and heated forms a polyimide layer having a surface containing three phases, but two components viz., polyimide and Pd particles.

Figure 5A:
FIG. 5A is a schematic representation of a three phase surface layer disposed on a polyimide layer.

Upon being cast, the Pd salt segregates and is trapped as colloidal species in the polymer as shown schematically in FIG. 5A. In FIG. 5A a polyimide layer 40 has a three phase surface film 42 of a Pd salt, and PMDA-ODA obtained from the two precursors.

When the layer is heated to a temperature in the range between approximately 200° C. and 220° C., the polymer further segregates with the Pd colloid becoming trapped in both of the polyimide phases, or at least in the less easily etched phase.

Figure 5B:
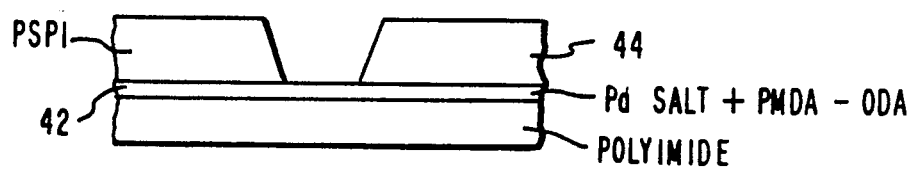
FIG. 5B is a schematic representation of a three phase surface layer overcoated with PSPI which was developed and etched to expose a roughened polyimide surface layer.
Figure 6:
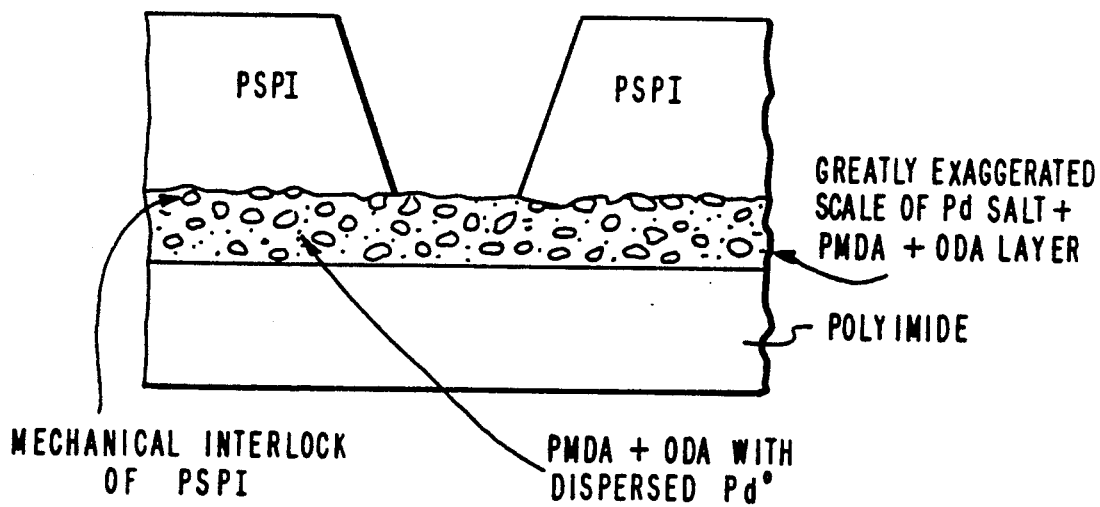
FIG. 6 is a schematic representation at a larger scale of the structure in FIG. 5B, and FIGS. 7A and 7B are graphical representations of dynamic mechanical thermal analysis (DMTA) of PAA and PAETE precursors of PMDA-ODA polyimide respectively.

The surface is then treated with an alkaline solution, such as KOH, for selective etching and seeding and the simultaneous opening of the Pd colloidal catalyst. The rough surface is then overcoated with a layer of photo sensitive PI 44 which is then exposed and developed as shown schematically in FIG. 5B and in a larger scale in FIG. 6. When the three phase containing layer of PMDA, ODA and Pd colloid is heated to a temperature in the range between approximately 300° to 350° C., but not to its fully ordered state, good polymer to polymer bonding is achieved between the PMDA-ODA and the PSPI. Therefore, good PSPI to polyimide adhesion is achieved after subsequent full cure of the polyimide. The partially cured polyimide provides a clean end point during PSPI development since PSPI can be exposed and developed at temperature below 120° C. The surface is plasma ashed or otherwise selectively treated in order to expose Pd° ions in the roughened layer 42. The polyimide when heated to temperatures above 180° C., is not attacked by typical developers of PSPI. Copper is then electrolessly deposited on the exposed layer 42. The thus deposited copper exhibits greatly enhanced adhesion to the polyimide surface using conventional resist.

It is known to those skilled in the art that Pd salt reduces to Pd° in polyimide when subjected to a temperature in the range between approximately 200° C. to 300° C. The dispersed Pd colloid in the bottom film provides catalytic activity. Colloidal particle interlock due to the presence 25 to 50 Å particles of Pd° and mechanical roughening as a result of the PMDA-ODA mixed phase provide excellent adhesion both on 200 Å and 1000 Å scales.

While the above description refers to PMDA-ODA polyimide polymers, the invention is equally applicable to other polymers composed of precursors forming multiple phases, for example BPDA-PDA. The dielectric layer can be applied by spinning, dipping, spraying, rollercoating of the polymer containing solution onto a substrate. While palladium is referred to as the seeding agent, it will be apparent to those skilled in the art that any conventional seeding metal, such as platinum, gold, copper, nickel, cobalt and alloys thereof including alloys with other elements such as tungsten and molydenum and carbon dispersions may also be used. While copper is the preferred electroless metal, nickel, cobalt, gold, palladium or any other electroless metal or metal alloy may be used in practicing the invention. Also, while NMP solvent is recited, other conventionally used polar solvent such as DMF (di methyl formamide), acetophenone, diglyme, triglyme and the like can equally well be used.

While there has been described and illustrated a method of improving the adhesion between an electrolessly deposited metal and an in situ roughened polymer surface, it will be apparent to those skilled in the art that variations and modifications are possible without deviating from the broad spirit and principle of the present invention which shall be limited solely by the scope of the claims appended hereto.

What is claimed is:

1. A method of improving adhesion of electroless metal deposited on an organic dielectric layer comprising the steps of:
   forming an organic dielectric layer by applying a ternary solution including a polar solvent and two polymer precursors which are separable into two polymer phases onto a substrate;
   heating the layer to separate the solution into two phases dispersed with different order for producing a rough surface;
   exposing the phase separated layer to an alkaline solution to produce a more roughened surface by etching of one of the polymer phases;
   seeding the roughened surface by immersion in a seeding bath containing a catalyst seeding agent; and electrolessly depositing a metal on the seeded surface.

2. A method of improving adhesion as set forth in claim 1 wherein said organic dielectric layer is a polyimide.

3. A method of improving adhesion as set forth in claim 2 wherein said two polymer precursors are an acid and an ester precursor of polyimide.

4. A method of improving adhesion as set forth in claim 3 wherein said two polymer precursors are PAA and PAETE.

5. A method of improving adhesion as set forth in claim 3 wherein said seeding bath contains a seeding agent selected from a group consisting of a palladium, platinum, gold, copper, nickel or cobalt salt or alloys thereof and carbon dispersions.

6. A method of improving adhesion as set forth in claim 3 wherein said metal is selected from the group consisting of copper, nickel, gold, cobalt, palladium and alloys thereof.

7. A method of improving adhesion as set forth in claim 3 wherein said seeding bath contains a palladium salt and said metal is copper.

8. A method of improving adhesion as set forth in claim 3 wherein said metal is copper.

9. A method of improving adhesion of electroless metal selectively deposited on an organic dielectric layer comprising the steps of:
   forming an organic dielectric layer by applying a quaternary solution including a polar solvent, a catalyst seeding agent, and two polymer precursors which are separable into two polymer phases onto a substrate;
   heating the layer to separate the layer into two polymer phases dispersed with different order, a colloidal metal phase formed from thermal decomposition of said seeding agent and a roughened surface on said layer;
   exposing the phase separated layer to an alkaline solution for opening said colloid at said surface;
   coating, exposing and developing a photoresist layer on the roughened surface; and
   electrolessly depositing a metal on the exposed roughened surface.

10. A method of improving adhesion as set forth in claim 9, where said organic dielectric layer is polyimide.

11. A method of improving adhesion as set forth in claim 10, wherein said photoresist layer is photosensitive polyimide.

12. A method of improving adhesion as set forth in claim 10 wherein said two polymer precursors are an acid and an ester precursor of polyimide.

13. A method of improving adhesion as set forth in claim 12, wherein said seeding agent is selected from the group consisting of palladium, platinum, gold, copper, nickel cobalt salt and alloys thereof and carbon dispersion.

14. A method of improving adhesion as set forth in claim 12, wherein said metal is selected from the group consisting of copper, nickel, gold, cobalt, palladium and alloys thereof.

15. A method of improving adhesion as set forth in claim 10, wherein said metal is copper.

16. A method of improving adhesion as set forth in claim 10, wherein said seeding agent is a palladium salt and said metal is copper.

* * * * *